United States Patent
Satoh

(10) Patent No.: US 10,249,812 B2
(45) Date of Patent: Apr. 2, 2019

(54) FILTER AND MULTIPLEXER

(71) Applicant: TAIYO YUDEN CO., LTD., Tokyo (JP)

(72) Inventor: Yoshio Satoh, Tokyo (JP)

(73) Assignee: TAIYO YUDEN CO., LTD., Tokyo (JP)

( * ) Notice: Subject to any disclaimer, the term of this patent is extended or adjusted under 35 U.S.C. 154(b) by 0 days.

(21) Appl. No.: 15/585,602

(22) Filed: May 3, 2017

(65) Prior Publication Data

US 2017/0331457 A1 Nov. 16, 2017

(30) Foreign Application Priority Data

May 11, 2016 (JP) .................................. 2016-095546

(51) Int. Cl.

| | |
|---|---|
| H03H 9/56 | (2006.01) |
| H03H 9/60 | (2006.01) |
| H01L 41/107 | (2006.01) |
| H03H 9/64 | (2006.01) |
| H03H 9/72 | (2006.01) |
| H03H 9/70 | (2006.01) |

(52) U.S. Cl.
CPC ........... *H01L 41/107* (2013.01); *H03H 9/605* (2013.01); *H03H 9/6483* (2013.01); *H03H 9/706* (2013.01); *H03H 9/725* (2013.01)

(58) Field of Classification Search
CPC ....... H01L 41/047; H03H 9/64; H03H 9/9605
USPC ......................................................... 333/133
See application file for complete search history.

(56) References Cited

U.S. PATENT DOCUMENTS

| | | | |
|---|---|---|---|
| 5,559,481 A | 9/1996 | Satoh et al. | |
| 7,464,265 B2* | 12/2008 | Ayyagari | H04L 63/065 380/268 |
| 7,728,696 B2* | 6/2010 | Stuebing | H03H 9/0014 330/302 |
| 8,193,877 B2* | 6/2012 | Fritz | H03H 9/706 333/133 |

(Continued)

FOREIGN PATENT DOCUMENTS

| | | |
|---|---|---|
| JP | 05-183380 A | 7/1993 |
| JP | 06-69750 A | 3/1994 |

(Continued)

OTHER PUBLICATIONS

Satoh et al., "SAW Duplexer Metallizations for High Power Durability", IEEE Ultrasonics Symposium Proceedings, pp. 17-26, 1998.

(Continued)

*Primary Examiner* — Dean O Takaoka
(74) *Attorney, Agent, or Firm* — Chen Yoshimura LLP

(57) ABSTRACT

A filter includes: an input terminal; an output terminal; and a ladder circuit that includes one or more series acoustic wave resonators connected in series between the input terminal and the output terminal and one or more parallel acoustic wave resonators connected in parallel between the input terminal and the output terminal, and in which characteristic impedance of at least one point in a pathway between the input terminal and the output terminal in a passband is greater than at least one of input impedance of the input terminal and output impedance of the output terminal in the passband.

15 Claims, 18 Drawing Sheets

(56) References Cited

U.S. PATENT DOCUMENTS

| | | | |
|---|---|---|---|
| 8,330,558 B2* | 12/2012 | Inoue | H03H 9/0042 333/133 |
| 8,923,794 B2* | 12/2014 | Aigner | H03H 9/02102 333/193 |
| 2004/0085160 A1 | 5/2004 | Nishimura et al. | |
| 2007/0290767 A1 | 12/2007 | Ali-Ahmad et al. | |
| 2008/0116993 A1* | 5/2008 | Yamakawa | H03H 9/568 333/124 |
| 2010/0007434 A1* | 1/2010 | Ohashi | H03H 7/38 333/133 |
| 2010/0073106 A1* | 3/2010 | Stuebing | H03H 9/542 333/187 |
| 2012/0112850 A1* | 5/2012 | Kim | H03H 7/38 333/32 |
| 2015/0341016 A1* | 11/2015 | Iwaki | H03H 9/205 333/133 |
| 2018/0131344 A1* | 5/2018 | Komatsu | H03H 7/075 |

FOREIGN PATENT DOCUMENTS

| | | |
|---|---|---|
| JP | 2001-24471 A | 1/2001 |
| JP | 2002-223102 A | 8/2002 |
| JP | 2004-158970 A | 6/2004 |

OTHER PUBLICATIONS

Ueda et al., "A Circuit Model for Nonlinear Simulation of Radio-Frequency Filters Using Bulk Acoustic Wave Resonators", IEEE translation on Ultrasonics, Ferroelectrics, and Frequency Control, vol. 55, No. 4, pp. 849-856, Apr. 2008.

Xiaoyu et al., "Integrated Passives on LTCC for Achieving Chip-Sized-Modules", Proceedings of the 38th European Microwave Conference, pp. 607-610, Oct. 2008.

Japanese Office Action dated Dec. 4, 2018, in a counterpart Japanese patent application No. 2016-095546. (A machine translation (not reviewed for accuracy) attached.).

* cited by examiner

FIG. 11

| TYPE | TARGET Zo' [Ω] | IL[dB] | | ATT[dB] | I[A] | |
|---|---|---|---|---|---|---|
| | | 1970 MHz | 2030 MHz | 2110 MHz | 1970 MHz | 2030 MHz |
| SECOND COMPARATIVE EXAMPLE | 50 | -2.02 | -2.21 | -53.3 | 0.1415 | 0.07892 |
| FIRST EMBODIMENT | 90 | -2.02 | -2.375 | -53.2 | 0.1159 | 0.05774 |
| | 100 | -2.1 | -2.34 | -52.1 | 0.1124 | 0.0551 |
| | 150 | -1.96 | -2.24 | -52.7 | 0.1054 | 0.04994 |
| | 200 | -1.61 | -2.4 | -53.7 | 0.081 | 0.0378 |

| TYPE | TARGET Zo' [Ω] | $I^2$ | | Zo[Ω] | | |
|---|---|---|---|---|---|---|
| | | 1970 MHz | 2030 MHz | 1970 MHz | 2000 MHz | 2030 MHz |
| SECOND COMPARATIVE EXAMPLE | 50 | 1 | 1 | 31.1 | 50.3 | 116.2 |
| FIRST EMBODIMENT | 90 | 0.670894 | 0.535278 | 52.6 | 79.7 | 208 |
| | 100 | 0.630986 | 0.487449 | 54.7 | 103.7 | 209.8 |
| | 150 | 0.554841 | 0.400427 | 74.3 | 148.5 | 301.6 |
| | 200 | 0.327685 | 0.229408 | 119.1 | 145.7 | 522.4 |

FIG. 13A $Z_0 = 50\ \Omega\quad C_{os} \times C_{op} = 2.533\ pF^2$

| EACH RESO-NATOR | Cos1 | Cop1 | Cos2 | Cop2 | Cos3 | Cop3 | Cos4 | Cop4 |
|---|---|---|---|---|---|---|---|---|
| CAPACI-TANCE [pF] | 0.8905 | 2.8569 | 0.9145 | 2.4117 | 1.2356 | 2.7976 | 0.7338 | 0.5421 |

| PRODUCT OF CAPACI-TANCES | Cos1 × Cop1 | Cop1 × Cos2 | Cos2 × Cop2 | Cop2 × Cos3 | Cos3 × Cop3 | Cop3 × Cos4 | Cos4 × Cop4 |
|---|---|---|---|---|---|---|---|
| [pF$^2$] | 2.5442 | 2.6125 | 2.2054 | 2.9798 | 3.4566 | 2.0528 | 0.3978 |
| AVERAGE OF PRODUCTS OF CAPACI-TANCES (Cos × Cop)ave [pF$^2$] | 2.3213 | | | | | | |
| (Cos × Cop)ave / (Cos × Cop) | 0.91 | | | | | | |

FIG. 13B $Z_0 = 100\ \Omega\quad C_{os} \times C_{op} = 0.6333\ pF^2$

| EACH RESO-NATOR | Cos1 | Cop1 | Cos2 | Cop2 | Cos3 | Cop3 | Cos4 | Cop4 |
|---|---|---|---|---|---|---|---|---|
| CAPACI-TANCE [pF] | 0.47854 | 1.6135 | 0.44 | 0.9732 | 0.5644 | 1.6552 | 0.389 | 0.373 |

| PRODUCT OF CAPACI-TANCES | Cos1 × Cop1 | Cop1 × Cos2 | Cos2 × Cop2 | Cop2 × Cos3 | Cos3 × Cop3 | Cop3 × Cos4 | Cos4 × Cop4 |
|---|---|---|---|---|---|---|---|
| [pF$^2$] | 0.7721 | 0.7099 | 0.4282 | 0.5493 | 0.9342 | 0.6438 | 0.1451 |
| AVERAGE OF PRODUCTS OF CAPACI-TANCES (Cos × Cop)ave [pF$^2$] | 0.5975 | | | | | | |
| (Cos × Cop)ave / (Cos × Cop) | 0.94 | | | | | | |

FIG. 14A $Z_0 = 150 \, \Omega \quad Cos \times Cop = 0.2814 \, pF^2$

| EACH RESONATOR | Cos1 | Cop1 | Cos2 | Cop2 | Cos3 | Cop3 | Cos4 | Cop4 |
|---|---|---|---|---|---|---|---|---|
| CAPACITANCE [pF] | 0.4 | 1.0938 | 0.3 | 0.7311 | 0.4067 | 0.9493 | 0.3 | 0.4297 |
| PRODUCT OF CAPACITANCES | Cos1× Cop1 | Cop1× Cos2 | Cos2× Cop2 | Cop2× Cos3 | Cos3× Cop3 | Cop3× Cos4 | Cos4× Cop4 | |
| [pF²] | 0.4375 | 0.3282 | 0.2193 | 0.2974 | 0.3861 | 0.2848 | 0.1289 | |
| AVERAGE OF PRODUCTS OF CAPACITANCES (Cos×Cop)ave [pF²] | | | | | | | 0.2975 | |
| (Cos×Cop)ave/(Cos×Cop) | | | | | | | 1.06 | |

FIG. 14B $Z_0 = 200 \, \Omega \quad Cos \times Cop = 0.1583 \, pF^2$

| EACH RESONATOR | Cos1 | Cop1 | Cos2 | Cop2 | Cos3 | Cop3 | Cos4 | Cop4 |
|---|---|---|---|---|---|---|---|---|
| CAPACITANCE [pF] | 0.2575 | 0.7515 | 0.25 | 0.5905 | 0.25 | 0.7283 | 0.25 | 0.303 |
| PRODUCT OF CAPACITANCES | Cos1× Cop1 | Cop1× Cos2 | Cos2× Cop2 | Cop2× Cos3 | Cos3× Cop3 | Cop3× Cos4 | Cos4× Cop4 | |
| [pF²] | 0.1935 | 0.1879 | 0.1476 | 0.1476 | 0.1821 | 0.1821 | 0.0758 | |
| AVERAGE OF PRODUCTS OF CAPACITANCES (Cos×Cop)ave [pF²] | | | | | | | 0.1595 | |
| (Cos×Cop)ave/(Cos×Cop) | | | | | | | 1.01 | |

US 10,249,812 B2

FILTER AND MULTIPLEXER

CROSS-REFERENCE TO RELATED APPLICATION

This application is based upon and claims the benefit of priority of the prior Japanese Patent Application No. 2016-095546, filed on May 11, 2016, the entire contents of which are incorporated herein by reference.

FIELD

A certain aspect of the present invention relates to a filter and a multiplexer.

BACKGROUND

High-frequency filters for separating radiofrequency and multiplexers such as duplexers using the high-frequency filters are used for wireless terminals such as mobile phones and smartphones. For such filters and multiplexers, used are Surface Acoustic Wave (SAW) filters and Bulk Acoustic Wave (BAW) filters. Ladder-type filters in which one-port resonators are connected in a ladder form have been known as such filters. In the ladder-type filter, series resonators are connected in series and parallel resonators are connected in parallel between an input terminal and an output terminal.

To improve the attenuation characteristic in the blocking band of the ladder-type filter, it has been known to make the input terminal, the output terminal, and the impedance of the series resonators and the parallel resonators have a predetermined relation as disclosed in, for example, Japanese Patent Application Publication No. 2004-158970 (hereinafter, referred to as Patent Document 1). In Patent Document 1, the term "characteristic impedance" is used, but is not the original meaning of the word. To make input/output impedance high, it has been known to make the impedance of the series resonators and the parallel resonators high as disclosed in, for example, Japanese Patent Application Publication No. 2001-24471.

In the ladder-type filter, it is desired to improve the power durability and/or the linearity without deteriorating the insertion loss.

SUMMARY OF THE INVENTION

According to a first aspect of the present invention, there is provided a filter including: an input terminal; an output terminal; and a ladder circuit that includes one or more series acoustic wave resonators connected in series between the input terminal and the output terminal and one or more parallel acoustic wave resonators connected in parallel between the input terminal and the output terminal, and in which characteristic impedance of at least one point in a pathway between the input terminal and the output terminal in a passband is greater than at least one of input impedance of the input terminal and output impedance of the output terminal in the passband.

According to a second aspect of the present invention, there is provided a multiplexer including the above filter.

BRIEF DESCRIPTION OF THE DRAWINGS

FIG. 11 presents the simulation results of the second comparative example and the first embodiment;

FIG. 13A presents the electrostatic capacitance of each resonator and the product of electrostatic capacitances when characteristic impedance Zo is 50Ω, and FIG. 13B presents the electrostatic capacitance of each resonator and the product of electrostatic capacitances when the characteristic impedance Zo is 100Ω;

FIG. 14A presents the electrostatic capacitance of each resonator and the product of electrostatic capacitances when the characteristic impedance Zo is 150Ω, and FIG. 14B presents the electrostatic capacitance of each resonator and the product of electrostatic capacitances when the characteristic impedance Zo is 200Ω;

DETAILED DESCRIPTION

Figure 1A:
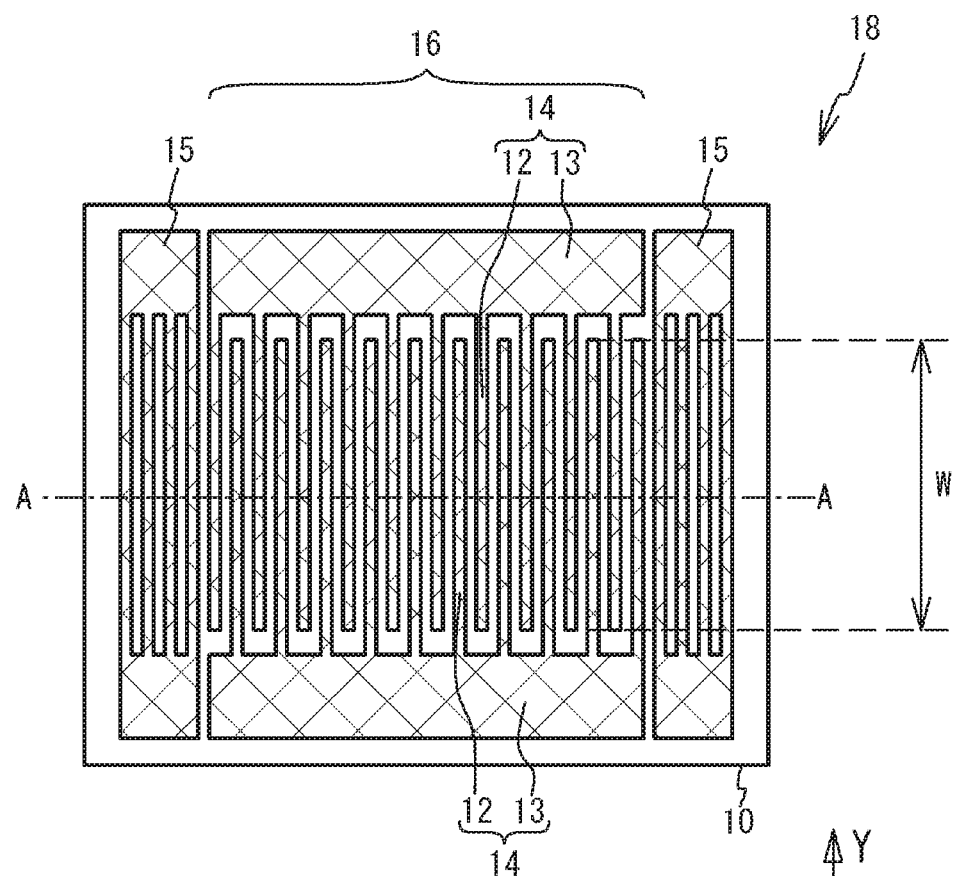
FIG. 1A is a plan view of a surface acoustic wave resonator.
Figure 1B:
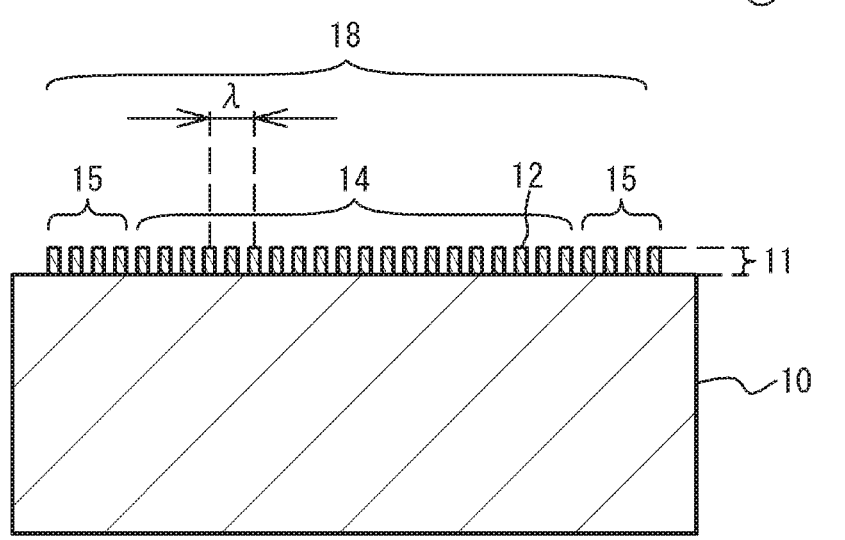
FIG. 1B is a cross-sectional view taken along line A-A in FIG. 1A.

A description will first be given of a one-port resonator used for embodiments. FIG. 1A is a plan view of a surface acoustic wave resonator, and FIG. 1B is a cross-sectional view taken along line A-A in FIG. 1A. As illustrated in FIG. 1A and FIG. 1B, an Inter Digital Transducer (IDT) 16 and reflectors 15 are formed on a piezoelectric substrate 10. The IDT 16 and the reflectors 15 are formed of a metal film 11 formed on the piezoelectric substrate 10. The IDT 16 includes a pair of comb-shaped electrodes 14 facing each other. The comb-shaped electrode 14 includes electrode fingers 12 and a bus bar 13 to which the electrode fingers 12 are coupled. The pair of comb-shaped electrodes 14 are located so that the electrode fingers 12 of one of the comb-shaped electrodes 14 and the electrode fingers 12 of the other of the comb-shaped electrodes 14 are alternately arranged with each other.

The surface acoustic wave excited by the electrode fingers 12 mainly propagate in the alignment direction of the electrode fingers 12. The propagated surface acoustic wave is reflected by the reflectors 15. The pitch of the electrode fingers 12 approximately corresponds to the wavelength λ of the surface acoustic wave. When the acoustic velocity of a surface acoustic wave under the IDT 16 is represented by Vs, the resonant frequency fr is expressed by fr=Vs/λ. The propagation direction of the surface acoustic wave is defined as an X direction, and a direction perpendicular to the propagation direction (i.e., the extension direction of the electrode finger 12) is defined as a Y direction. The X direction and the Y direction do not necessarily correspond to the X-axis direction and the Y-axis direction of the crystal orientation of the piezoelectric substrate 10. In the Y direction, a length along which the electrode fingers 12 of one of the pair of the comb-shaped electrodes 14 overlap with the electrode fingers 12 of the other is an aperture width W.

The piezoelectric substrate 10 is, for example, a lithium tantalate substrate or a lithium niobate substrate. When the piezoelectric substrate 10 is a rotated Y-cut X-propagation lithium tantalate substrate or a lithium niobate substrate, the X direction corresponds to the X-axis direction of the crystal orientation. The piezoelectric substrate 10 may be bonded on an insulating substrate such as a sapphire substrate, a spinel substrate, or an alumina substrate, or a semiconductor substrate such as a silicon substrate. The metal film 11 is, for example, an aluminum film or a copper film. A protective film or a temperature compensation film covering the IDT 16 and the reflectors 15 may be provided.

Figure 2A:
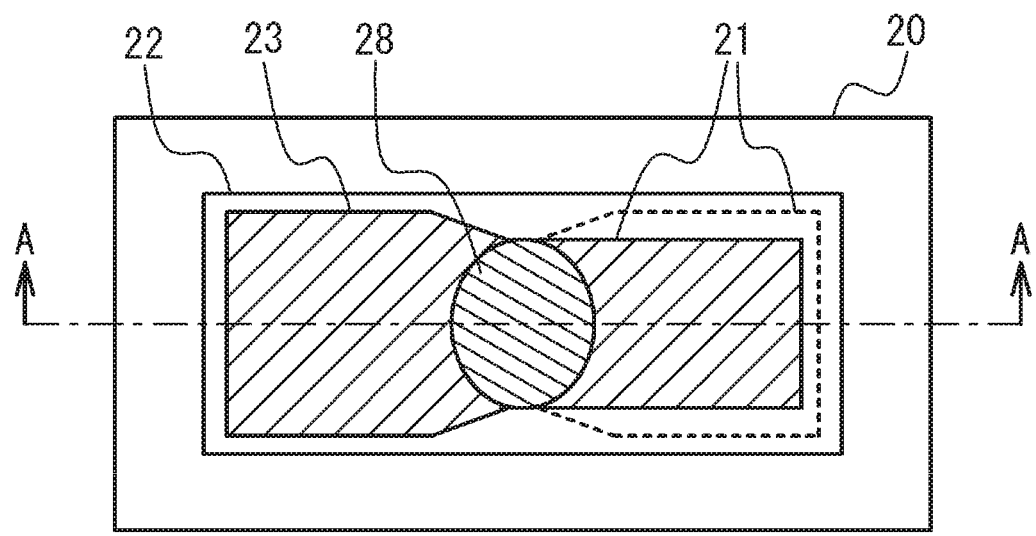
FIG. 2A is a cross-sectional view of a bulk acoustic wave resonator.
Figure 2B:
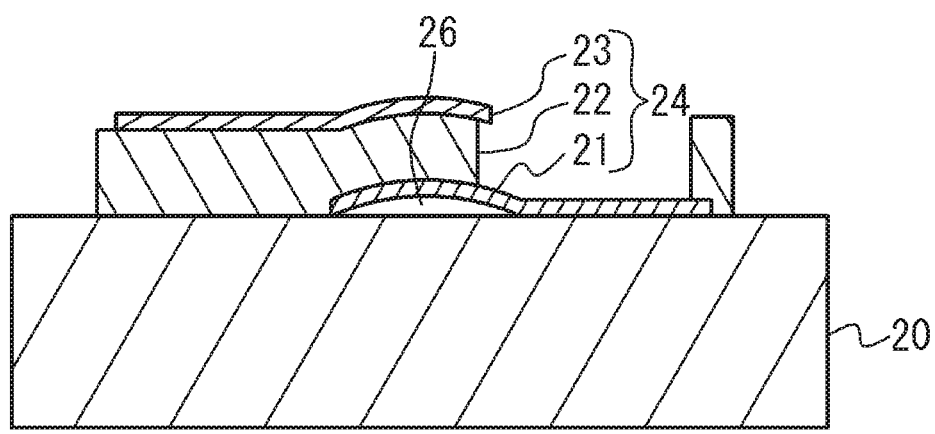
FIG. 2B is a cross-sectional view taken along line A-A in FIG. 2A.

FIG. 2A is a cross-sectional view of a bulk acoustic wave resonator, and FIG. 2B is a cross-sectional view taken along line A-A in FIG. 2A. As illustrated in FIG. 2A and FIG. 2B, a lower electrode 21 is located on a substrate 20. An air gap 26 having a dome-shaped bulge is formed between the flat principal surface of the substrate 20 and the lower electrode 21. A piezoelectric film 22 is located on the lower electrode 21. An upper electrode 23 is located on the piezoelectric film 22 so as to have a region (a resonance region 28) where the upper electrode 23 faces the lower electrode 21 across the piezoelectric film 22. A multilayered film 24 in the resonance region 28 includes the lower electrode 21, the piezoelectric film 22, and the upper electrode 23. The resonance region 28 is a region that has an elliptical shape, and in which the bulk acoustic wave in the thickness extension mode resonates. In plan view, the resonance region 28 is included in the air gap 26. The acoustic wave is reflected by the space above the upper electrode 23 and the air gap 26. When the acoustic velocity of a bulk wave is represented by Vb, and the total film thickness of the multilayered film 24 is represented by hr, the antiresonant frequency fa is expressed by fa=Vb/2 hr.

Used as the substrate 20 is, for example, a silicon substrate. The substrate 20 may be, for example, a semiconductor substrate such as GaAs, or an insulating substrate such as a sapphire substrate, a spinel substrate, an alumina substrate, a glass substrate, or a ceramic substrate. Used as the lower electrode 21 and the upper electrode 23 is, for example, a composite film including a ruthenium (Ru) film, which is located closer to the piezoelectric film 22, and a chrome (Cr) film, which is located closer to the outside. The lower electrode 21 and the upper electrode 23 may be formed of, instead of a Ru film and a Cr film, a single-layer film of aluminum (Al), titanium (Ti), copper (Cu), molybdenum (Mo), tungsten (W), tantalum (Ta), platinum (Pt), rhodium (Rh), or iridium (Ir), or a composite film of at least two of them.

Used as the piezoelectric film 22 is, for example, an aluminum nitride (AlN) film having the (002) direction as a main axis. The piezoelectric film 22 may be made of, instead of aluminum nitride, zinc oxide (ZnO), lead zirconate titanate (PZT), or lead titanate (PbTiO$_3$). In addition, for example, the piezoelectric film 22 may be mainly composed of aluminum nitride, and contain other elements for improving the resonance characteristic or the piezoelectricity. For example, the use of scandium (Sc), a group II element and a group IV element, or a group II element and a group V element as additive elements improves the piezoelectricity of the piezoelectric film 22. Accordingly, the effective electromechanical coupling coefficient of the piezoelectric thin film resonator can be improved. The group II element is, for example, calcium (Ca), magnesium (Mg), strontium (Sr), or zinc (Zn). The group IV element is, for example, Ti, zirconium (Zr), or hafnium (Hf). The group V element is, for example, Ta, niobium (Nb), or vanadium (V). Furthermore, the piezoelectric film 22 may be composed of aluminum nitride, and contain boron (B).

The multilayered film 24 in the resonance region 28 may include a load film for adjusting the frequency, an insertion film for improving the Q-value, and/or a temperature compensation film for reducing the temperature dependence of frequency.

The bulk wave resonator may be a so-called Film Bulk Acoustic Resonator (FBAR) using the air gap 26, or a so-called Solidly Mounted Resonator (SMR) using an acoustic mirror instead of the air gap 26. The planar shape of the resonance region 28 may be a polygonal shape.

Figure 3:
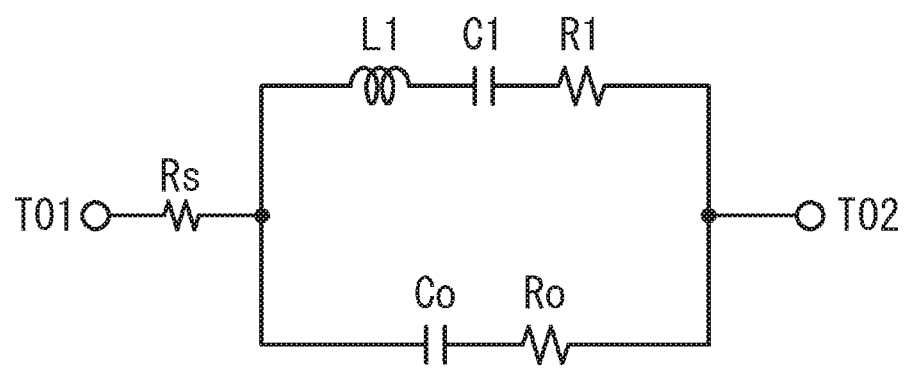
FIG. 3 illustrates an equivalent circuit of a one-port resonator.

Used for a one-port resonator using a surface acoustic wave or a bulk acoustic wave is an equivalent circuit using a modified Butterworth-Van-Dyke (mBVD) model. FIG. 3 is an equivalent circuit of a one-port resonator. As illustrated in FIG. 3, a path in which an inductor L1, a capacitor C1, and a resistor R1 are connected in series and a path in which a capacitor Co and a resistor Ro are connected in series are connected in parallel between terminals T01 and T02. A resistor Rs is connected in series with the two paths. The capacitor Co represents the electrostatic capacitance Co of the one-port resonator. The resistor Ro represents a leakage resistance. The inductor L1 and the capacitor C1 represent mechanical resonance. The resistor R1 represents a mechanical resonant resistance. The resistor Rs represents the resistance of an electrode.

The electrostatic capacitance Co of the surface acoustic wave resonator can be calculated by the following equation.

$$Co = 2 \times N \times W \times F(\eta) \times C0 \quad (1)$$

Where N represents the number of pairs in the IDT 16, W represents the aperture width, F(η) represents the function of the metallization ratio η, and C0 represents the electrostatic capacitance per unit length of one electrode finger 12. When the width in the X direction of the electrode finger 12 is represented by We, η=2×We/λ. The electrostatic capacitance Co of the bulk acoustic wave resonator can be calculated by the following equation.

$$Co = \varepsilon S/d \quad (2)$$

Where ε represents the permittivity of the piezoelectric film 22 (relative permittivity εr×permittivity of vacuum ε0), S represents the area of the resonance region 28, and d represents the film thickness of the piezoelectric film 22.

Figure 4A:
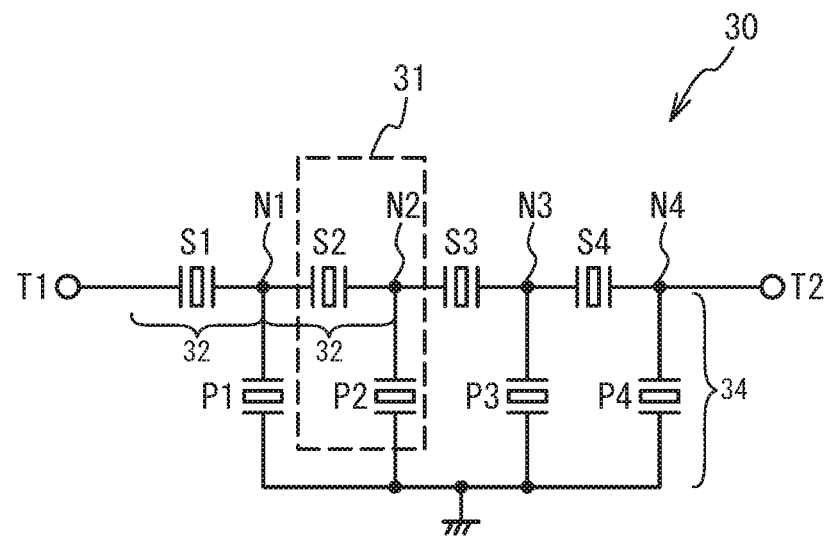
FIG. 4A is a circuit diagram of a ladder-type filter.
Figure 4B:
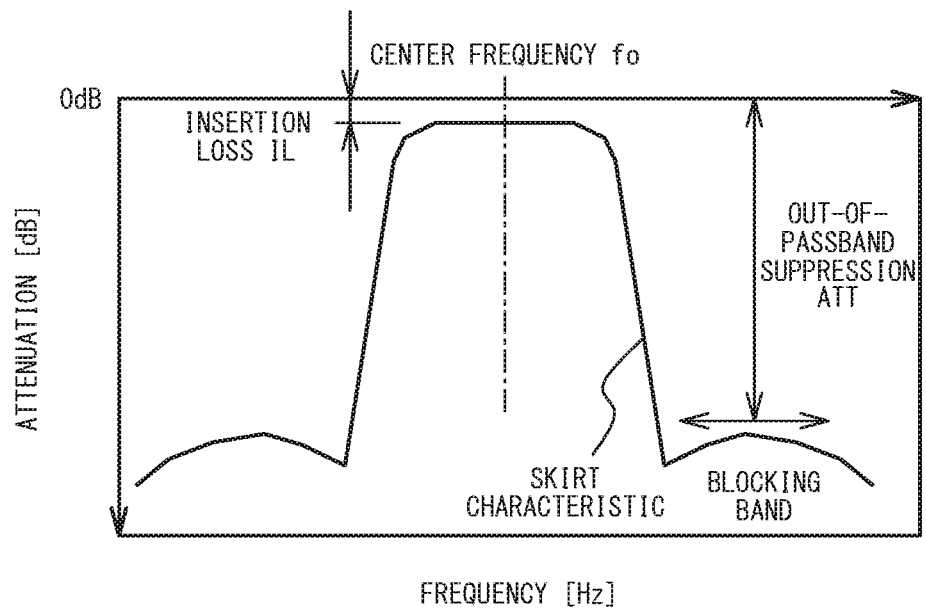
FIG. 4B illustrates the transmission characteristic of the ladder-type filter.

FIG. 4A is a circuit diagram of a ladder-type filter, and FIG. 4B illustrates the transmission characteristic of the ladder-type filter. As illustrated in FIG. 4A, a ladder circuit 30 includes series resonators S1 through S4 and parallel resonators P1 through P4. The series resonators S1 through S4 are connected in series between terminals T1 and T2. The parallel resonators P1 through P4 are connected in parallel between the terminals T1 and T2. Nodes N1 through N4 are nodes at which the parallel resonators P1 through P4 connect to the pathway from the terminal T1 to the terminal T2, respectively. Serial arms 32 are located between the terminal T1 and the node N1 and between adjacent nodes of the nodes N1 through N4. Parallel arms 34 are located between each of the nodes N1 through N4 and a ground. In the example of FIG. 4A, each of the series arm 32 and the parallel arm 34 has one one-port resonator, respectively. The series arm 32 and the parallel arm 34 adjacent to each other form a basic section 31. The example in FIG. 4A is a ladder-type filter having four basic sections 31. It is sufficient if one or more series resonators are provided and one or more parallel resonators are provided in each arm, and the number of series resonators and the number of parallel resonators can be appropriately set in accordance with desired filter characteristics, separately.

As illustrated in FIG. 4B, the ladder-type filter functions as a bandpass filter by, for example, making the resonant frequencies slightly different between the series resonators S1 through S4 and the parallel resonators P1 through P4 (for example, Japanese Patent Application Publication No. 5-183380). The passband has a center frequency fo, the attenuation of the passband corresponds to insertion loss IL, and the attenuation of the blocking band corresponds to out-of-passband suppression ATT. In the filter used for a duplexer, the blocking band is set to the passband of the counterpart filter. The insertion loss IL is preferably small (ideally zero), and the out-of-passband suppression ATT is preferably large (ideally infinite).

Figure 5:
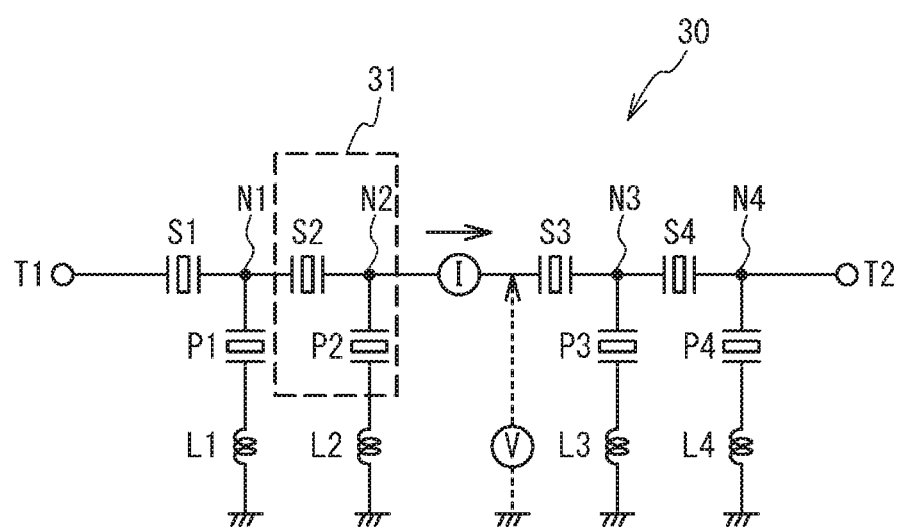
FIG. 5 is a diagram for describing characteristic impedance in the ladder-type filter.

FIG. 5 is a diagram for describing characteristic impedance in the ladder-type filter. As illustrated in FIG. 5, inductors L1 through L4 are connected between the parallel resonators P1 through P4 and a ground, respectively. The inductors L1 through L4 may not be necessarily connected. Even when the inductors L1 through L4 are not purposefully connected, they may be connected as a parasitic inductor. Other relations of connection are the same as those of FIG. 4A, and the description thereof is thus omitted.

When a voltage at the node N2 with respect to a ground is represented by V, and a current flowing through the node N2 from the terminal T1 to the terminal T2 is represented by I, characteristic impedance Zo at the node N2 is expressed by the following equation.

$$Zo=V/I \quad (3)$$

An electrical power P passing the node N2 is expressed by the following equation.

$$P=V \times I = I^2 \times Zo \quad (4)$$

The characteristic impedance can be defined in a series pathway between the terminals T1 and T2. For example, the characteristic impedance can be defined with respect to the nodes N1, N3, and N4 in the same manner. The characteristic impedance at the node N2 corresponds to the characteristic impedance of the basic unit 31 including the series resonator S2 and the parallel resonator P2. When the characteristic impedance Zo is approximately the same at any point in the pathway between the terminals T1 and T2 (i.e., at all the nodes N1 through N4), the characteristic impedance Zo is specified to be the characteristic impedance of the ladder-type filter. Although the characteristic impedance Zo depends on frequency, when not particularly referred to, the characteristic impedance Zo means the characteristic impedance at the center frequency fo of the passband.

When a predetermined electrical power P=VI is made to pass the ladder circuit 30, the higher the characteristic impedance Zo is, the less the current value I is. That is, the electrical power P is transmitted by the voltage V more than by the current value I. For example, when the characteristic impedance Zo doubles, the current value I flowing through the ladder circuit 30 becomes $1/\sqrt{2}$ by estimate. One of the factors that determine the power durability of the ladder circuit 30 is Joule heat generated by the current flowing the electrode (for example, the IDT 16 in FIG. 1A, or the lower electrode 21 and the upper electrode 23 in FIG. 2B). When Joule heat rises the temperature of the electrode, the migration or meltdown of the electrode material occurs. Joule heat is proportional to the square of a current value. Thus, when the current value I becomes $1/\sqrt{2}$, the power durability improves approximately doubles. In addition, it has been known that the second harmonics are proportional to the square of current, and the third harmonics are proportional to the cube of current (for example, IEEE Trans. On Ultrasonics, Ferroelectrics, and Frequency Control, Vol. 55, pp 849-856 2008). Therefore, as the current value I decreases, the linearity of the filter improves.

First Embodiment

Figure 6:
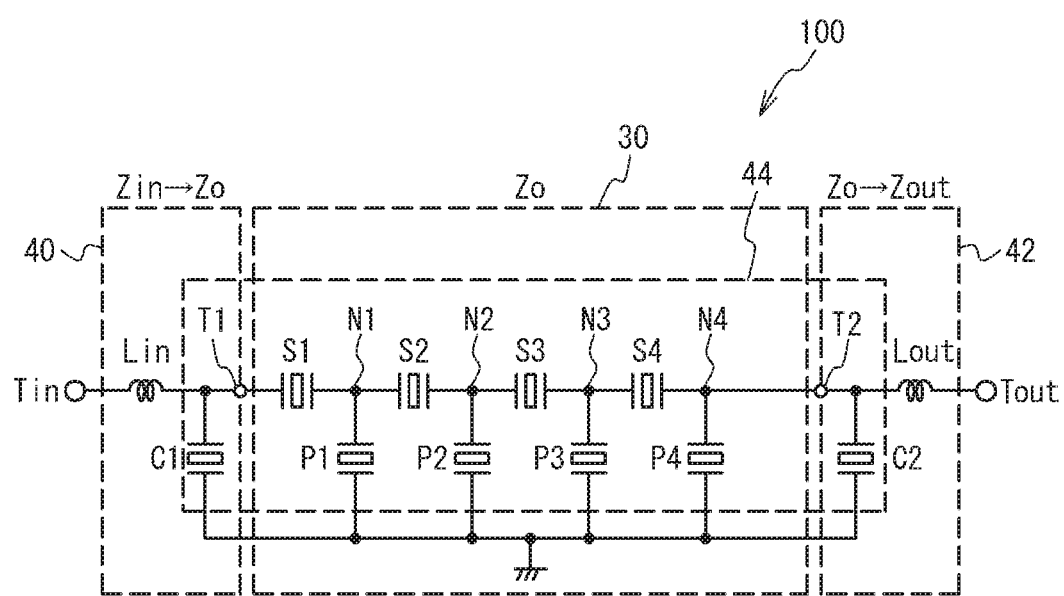
FIG. 6 is a circuit diagram of a filter in accordance with a first embodiment.

Embodiments based on the above discussion will be described. FIG. 6 is a circuit diagram of a filter in accordance with a first embodiment. In a filter 100, an input impedance conversion section 40, the ladder circuit 30, and an output impedance conversion section 42 are connected in series. The input impedance of the input terminal Tin is Zin, and the output impedance of the output terminal Tout is Zout. Although the input impedance Zin and the output impedance Zout depend on frequency, when not particularly referred to, the input impedance Zin and the output impedance Zout respectively mean the input impedance Zin and the output impedance Zout at the center frequency fo of the passband. The characteristic impedance of the ladder circuit 30 is Zo. That is, the characteristic impedance at each of the nodes N1 through N4 is Zo.

The input impedance conversion section 40 converts the input impedance Zin into the characteristic impedance Zo. The input impedance conversion section 40 includes an inductor Lin connected in series between the input terminal Tin and the terminal T1 and a capacitor C1 connected between the terminal T1 and a ground. The output impedance conversion section 42 converts the characteristic impedance Zo into the output impedance Zout. The output impedance conversion section 42 includes an inductor Lout connected in series between the terminal T2 and the output terminal Tout and a capacitor C2 connected between the terminal T2 and a ground.

The capacitors C1 and C2 are, for example, the electrostatic capacitance Co in FIG. 3 of acoustic wave resonators. The resonant frequencies fr of the acoustic wave resonators used for the capacitors C1 and C2 are made to differ from the passband of the ladder circuit 30. This configuration allows the acoustic wave resonator to be used as a capacitor. For example, when the center frequency of the passband of the ladder circuit 30 is fo, the resonant frequency fr is made to be fo/2 or less or to be 2×fo or greater.

The acoustic wave resonators used for the capacitors C1 and C2 are located on a single substrate 44 on which the series resonators S1 through S4 and the parallel resonators P1 through P4 are also located. In the case of a surface acoustic wave filter, the substrate 44 is the piezoelectric substrate 10 in FIG. 1A and FIG. 1B. In the case of a bulk acoustic wave filter, the substrate 44 is the substrate 20 in FIG. 2A and FIG. 2B. The electrostatic capacitances of the capacitors C1 and C2 can be set with use of the equation 1 or the equation 2.

Each resonator of the filter was optimally designed with use of automatic optimization software that optimizes the design value of each resonator (each value in the equivalent circuit illustrated in FIG. 3) with use of the mBVD model so that target filter characteristics are satisfied as much as possible. As an example, the center frequency of the passband of the ladder circuit 30 was set to 2000 MHz, the passband was set to 60 MHz from 1970 MHz to 2030 MHz, and the blocking band was set to 2050 MHz to 2110 MHz. The insertion loss IL, which is a target for optimization, was set to −1.0 dB, and the out-of-passband suppression ATT of the blocking band was set to −58 dB. In comparative examples, the ladder circuit 30 without the input impedance conversion section 40 and the output impedance conversion section 42 was optimally designed.

As a first comparative example, the input impedance Zin of the terminal T1, the output impedance Zout of terminal T2, and the characteristic impedance Zo were all set to 150Ω, and the optimization design was performed. In addition, as a second comparative example, Zin, Zout, and Zo were all set to 50Ω, and the optimization design was performed. The pass characteristic (S21) and the Voltage Standing Wave Ratio (VSWR) of the filters of the first and second comparative examples were simulated.

Figure 7A:
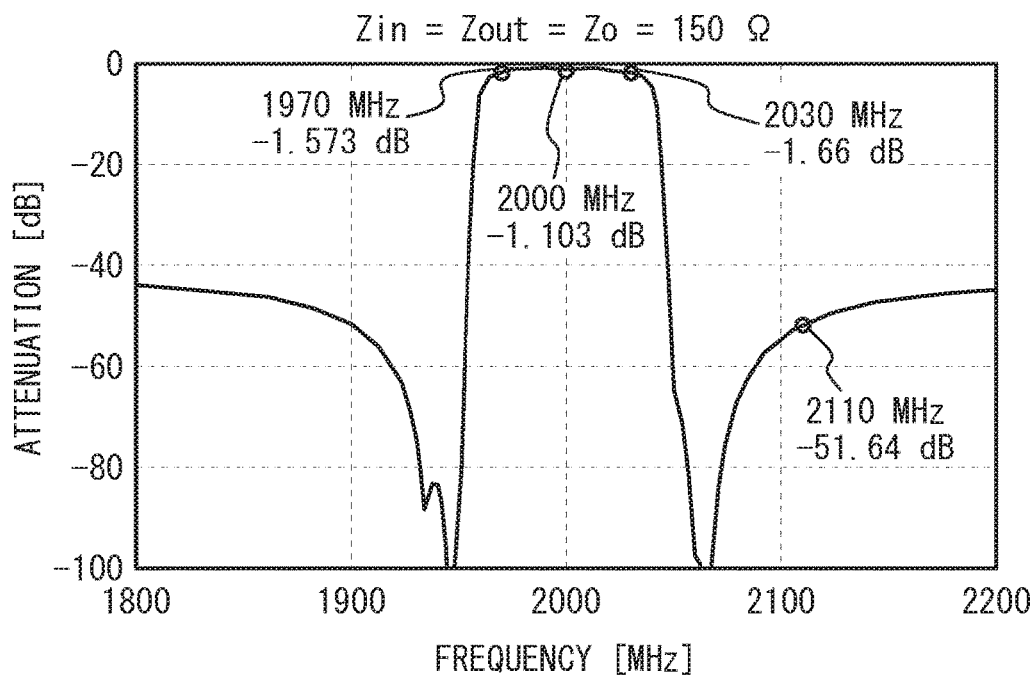
FIG. 7A and FIG. 7B illustrate the transmission characteristic and the VSWR of a filter in accordance with a first comparative example, respectively.
Figure 7B:
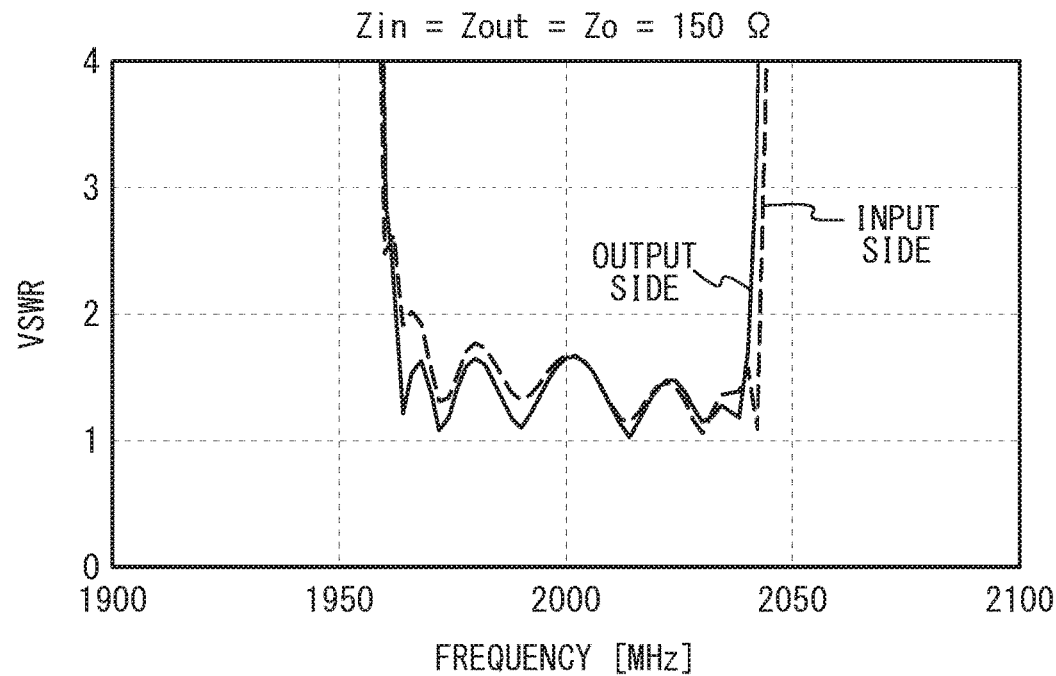

FIG. 7A and FIG. 7B illustrate the transmission characteristic and the VSWR of the filter in accordance with the first comparative example, respectively. As illustrated in FIG. 7A, the insertion losses at the low frequency end, at the center frequency, and at the high frequency end of the passband are respectively −1.573 dB, −1.103 dB, and −1.66 dB. The worst out-of-passband suppression in the blocking band is −51.64 dB at 2110 MHz. As illustrated in FIG. 7B, the worst value of the VSWR at the input side in the passband (dashed line) is 1.7, and the worst value of the VSWR at the output side in the passband (solid line) is 1.66.

Figure 8A:
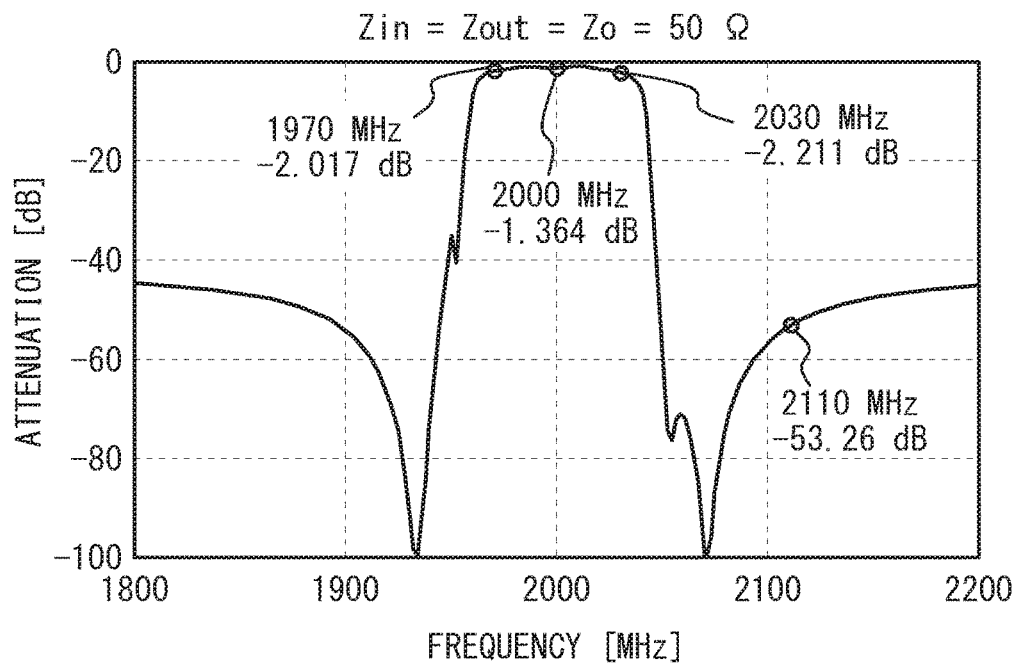
FIG. 8A and FIG. 8B illustrate the transmission characteristic and the VSWR of a filter in accordance with a second comparative example, respectively.
Figure 8B:
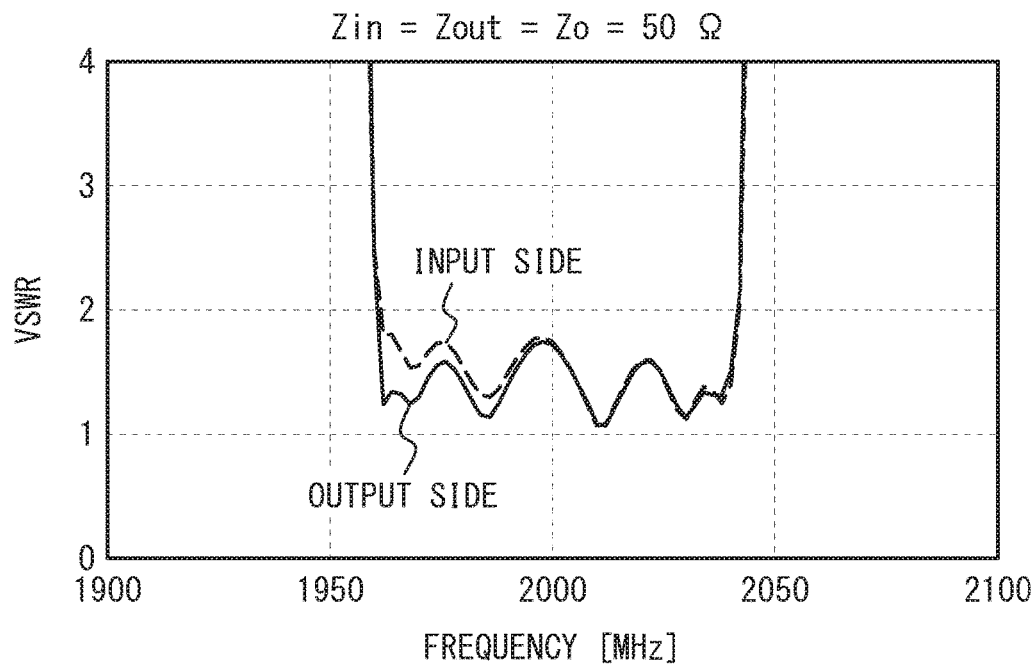

FIG. 8A and FIG. 8B illustrate the transmission characteristic and the VSWR of the filter in accordance with the second comparative example, respectively. As illustrated in FIG. 8A, the insertion losses at the low frequency end, at the center frequency, and at the high frequency end of the passband are respectively −2.017 dB, −1.364 dB, and −2.211 dB. The worst out-of-passband suppression in the blocking band is −53.26 dB at 2110 MHz. As illustrated in FIG. 8B, the worst value of the VSWR at the input side in the passband (dashed line) is 1.78, and the worst value of the VSWR at the output side in the passband (solid line) is 1.74.

In the first comparative example, the insertion loss is improved compared to that in the second comparative example by making the characteristic impedance Zo high. The average of the insertion losses at the low frequency end and at the high frequency end of the passband in the first comparative example improves more than that in the second comparative example by 0.5 dB. This is because in the first comparative example, the current value I was reduced by making the characteristic impedance Zo high, and the insertion loss due to the resistance was decreased.

Next, as the first embodiment, the input impedance Zin and the output impedance Zout were set to 50Ω, the characteristic impedance Zo of the ladder circuit 30 was set to 150Ω, and the optimization design was performed. The inductance of the inductor Lin of the input impedance conversion section 40 was set to 5 nH, and the Q-value of the inductor was set to 50. The inductance of the inductor Lout of the output impedance conversion section 42 was set to 6 nH, and the Q-value of it was also set to 50. The capacitances of the capacitors C1 and C2 were set to 0.7 pF. The capacitors C1 and C2 were assumed to be acoustic wave resonators similar to the series resonators and the parallel resonators in the ladder circuit 30, the Q-value was set to approximately equal to those of the series resonators and the parallel resonators, and the resonant frequency was set to ½ of the center frequency of the passband, i.e., 1000 MHz.

Figure 9A:
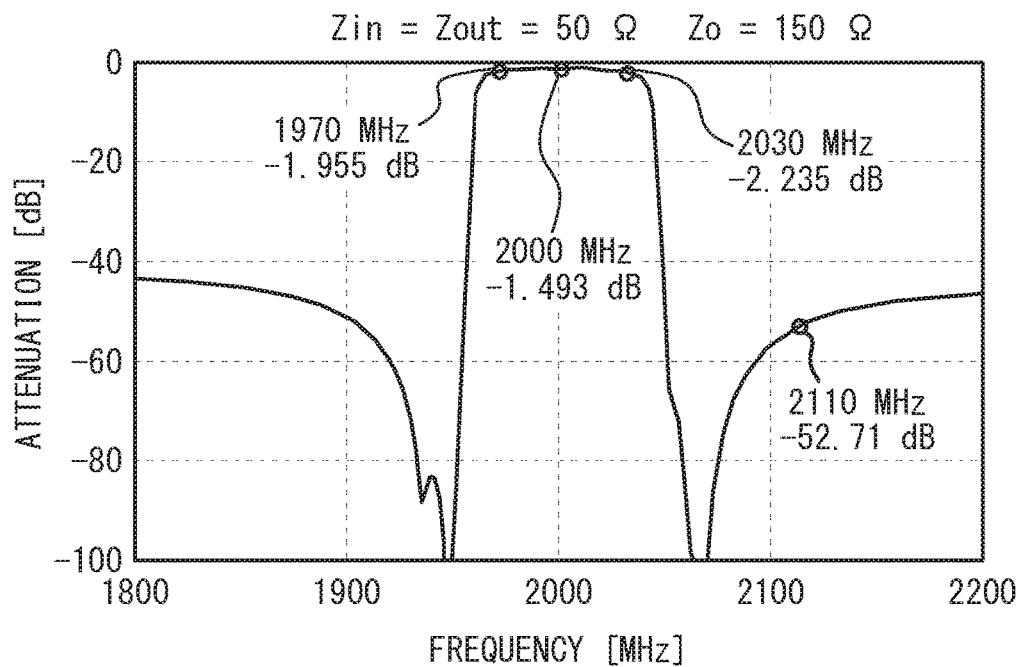
FIG. 9A and FIG. 9B illustrate the transmission characteristic and the VSWR of the filter in accordance with the first embodiment, respectively.
Figure 9B:
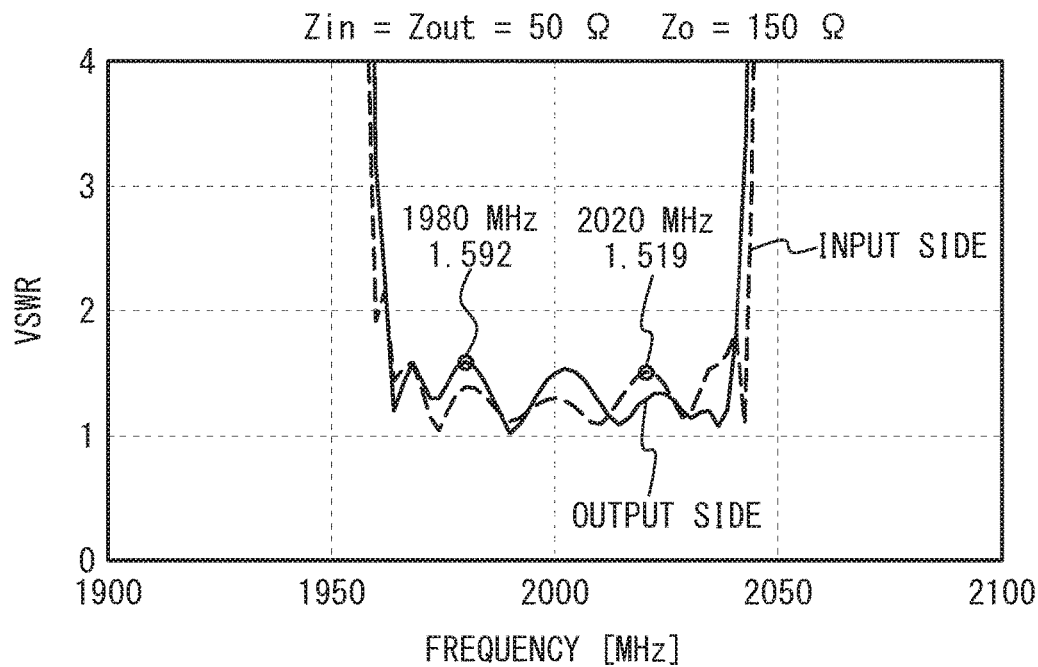

FIG. 9A and FIG. 9B illustrate the transmission characteristic and the VSWR of the filter in accordance with the first embodiment, respectively. As illustrated in FIG. 9A, the insertion losses at the low frequency end, at the center frequency, and at the high frequency end of the passband are respectively −1.955 dB, −1.493 dB, and −2.235 dB. The worst out-of-passband suppression in the blocking band is −52.71 dB at 2110 MHz. As illustrated in FIG. 9B, the worst value of the VSWR at the input side in the passband (dashed line) is 1.519, and the worst value of the VSWR at the output side in the passband (solid line) is 1.592.

The average of the insertion losses at the low frequency end and at the high frequency end of the passband in the first embodiment improves more than that in the second comparative example only by 0.02 dB. This is because the insertion losses of the input impedance conversion section 40 with low Q inductor Lin and the output impedance conversion section 42 with low Q inductor Lout were added to the first comparative example. The out-of-passband suppression hardly differs from that of the second comparative example, and the VSWR improved a little compared to that of the second comparative example. As described above, from the perspective of the insertion loss, the out-of-passband suppression, and the VSWR, the first embodiment has little benefit.

But the first embodiment has large benefit for the following aspect. In the first embodiment and the second comparative example, the maximum amplitude value (peak value) of the current flowing through the series resonator S3 when a signal of 26 dBm is input to the input terminal Tin was simulated as a current value I.

Figure 10A:
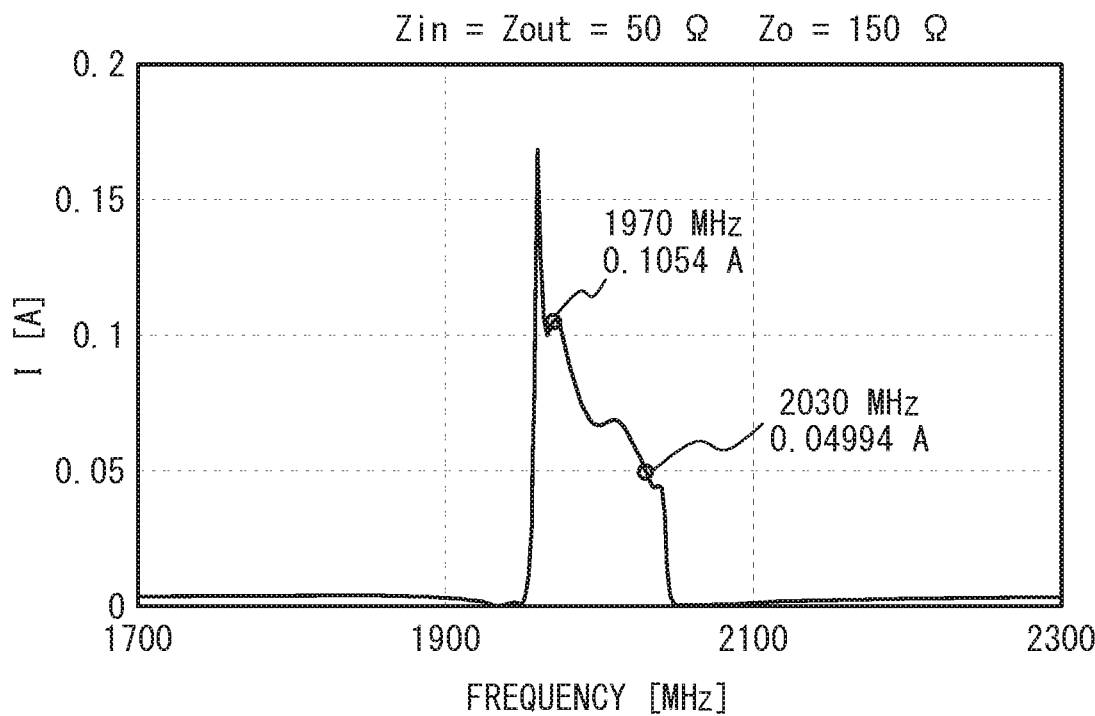
FIG. 10A and FIG. 10B are graphs of current value I versus frequency in the first embodiment and the second comparative example, respectively.
Figure 10B:
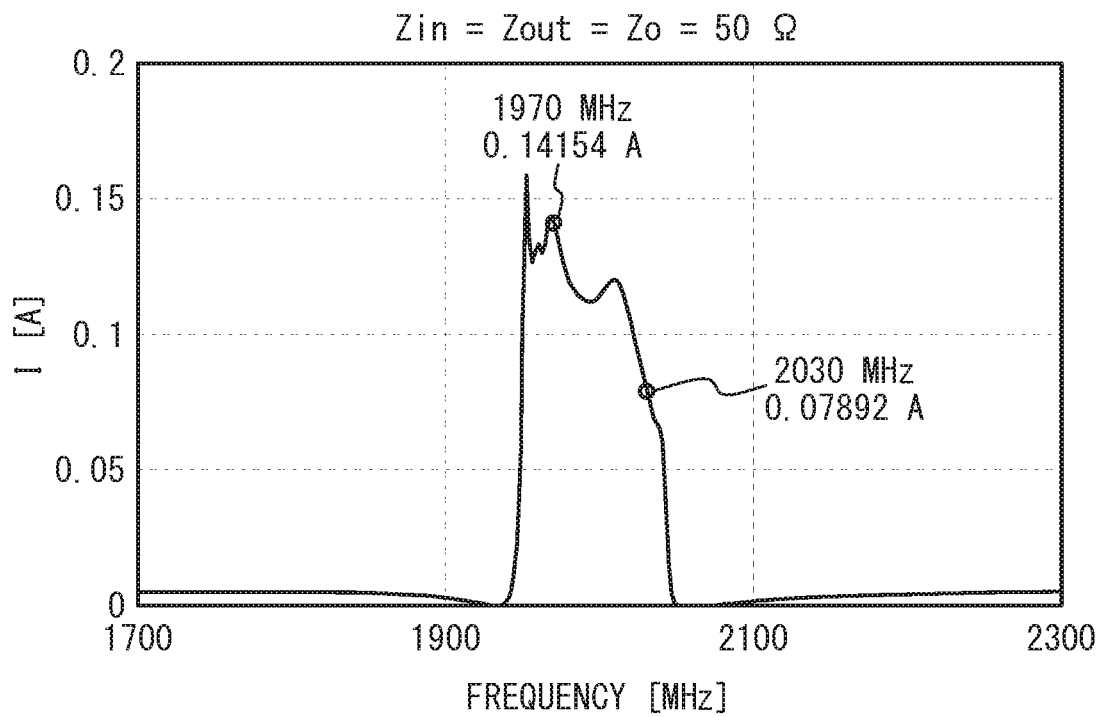

FIG. 10A and FIG. 10B are graphs of current value I versus frequency in the first embodiment and the second comparative example, respectively. As illustrated in FIG. 10A, in the first embodiment, the current values I at the low frequency end and at the high frequency end of the passband are respectively 0.1054 A and 0.04994 A. As illustrated in FIG. 10B, in the second comparative example, the current values I at the low frequency end and at the high frequency end of the passband are respectively 0.14154 A and 0.07892 A. The current value I at the low frequency end in the first embodiment is approximately 74% of that in the second comparative example. $I^2$, which is proportional to the electrical power, in the first embodiment is approximately 55% of that in the second comparative example. At the high frequency end, the current value I in the first embodiment is approximately 63% of that in the second comparative example, and $I^2$ in the first embodiment is approximately 40% of that in the second comparative example. It has been known that in a transmit filter, the power durability is least at the high frequency end both in the surface acoustic wave filter and the bulk acoustic wave filter (for example, 1998 IEEE Ultrasonics Symposium Proceedings, pp 17-29, 1998). When the first embodiment is applied to a transmit filter, the power durability becomes 1/0.4=2.5 times the power durability of the second comparative example.

In the same manner, the simulation was conducted after changing the characteristic impedance of the ladder circuit 30. FIG. 11 presents the simulation results of the second comparative example and the first embodiment. The second comparative example includes neither the input impedance conversion section 40 nor the output impedance conversion section 42. The input impedance Zin and the output impedance Zout of the first embodiment are 50Ω. The input impedance conversion section 40 converts 50Ω of the input impedance Zin into the characteristic impedance Zo, while the output impedance conversion section 42 converts the characteristic impedance Zo into 50Ω of the output impedance Zout. A target Zo' is the target characteristic impedance Zo at the center frequency fo of the passband. The transmission characteristic and the like of the optimally designed filter were simulated.

The insertion loss IL of the first embodiment differs little from that of the second comparative example at any target Zo'. This is because since the inductors Lin and Lout with a Q-value of 50 were used, the input impedance conversion section 40 and the output impedance conversion section 42 deteriorated the insertion loss. The out-of-passband suppression ATT in the blocking band of the first embodiment is approximately equal to that of the second comparative example at any target Zo'. The current value I of the first embodiment decreases as the target Zo' increases. $I^2$ normalized by $I^2$ of the second comparative example decreases as the target Zo' increases. When the target Zo' is made to be 100Ω or greater, $I^2$ at 2030 MHz becomes half of $I^2$ of the second comparative example or less. Accordingly, the power durability becomes more than twice the power durability of the second comparative example. The optimized characteristic impedance Zo increases in proportion to the target Zo' at the low frequency end (1970 MHz), at the center frequency (2000 MHz), and at the high frequency end (2030 MHz) of the passband. The characteristic impedance Zo at the center frequency when the target Zo' is 200Ω is slightly different from the above-described relation, but this is considered to result from the optimization. However, since the characteristic impedance Zo is averagely approximately proportional to the target Zo across the entire passband even when the target Zo' is 200Ω, this is considered not to be a big problem.

A method of setting the characteristic impedance of the ladder circuit 30 in the first embodiment will be described. In a basic unit including one series resonator and one parallel resonator, assume that the electrostatic capacitance of the series resonator is Cos, and the electrostatic capacitance of the parallel resonator is Cop. At this time, it has been known that the characteristic impedance Zo and the center frequency fo of the passband have the following relationship (for example, Japanese Patent Application Publication No. 6-69750).

$$Zo^2 = 1/((2\pi fo)^2(Cos \times Cop)) \quad (5)$$

For example, to triple Zo, Cos and Cop are made to be approximately ⅓ of original Cos and original Cop, respectively.

Figure 12:
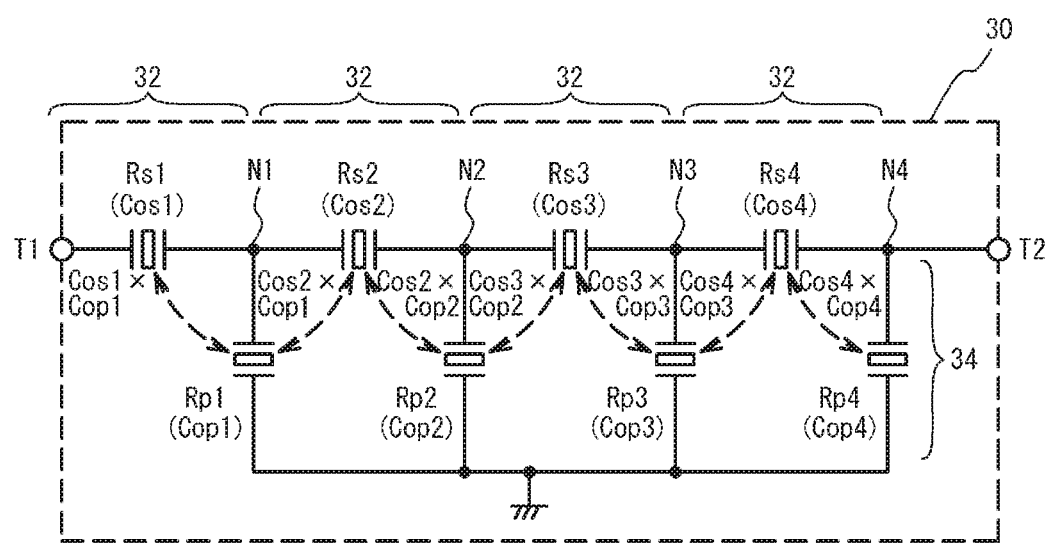
FIG. 12 illustrates the electrostatic capacitance of each resonator in the first embodiment.

When the number of the basic units 31 is two or more, it becomes complicated. Thus, examined was a method for simply expressing the characteristic impedance Zo with use of Cop and Cos of each basic unit 31. FIG. 12 illustrates the electrostatic capacitance of each resonator in the first embodiment. As illustrated in FIG. 12, each of series arm resonator Rs1 through Rs4 is coupled to the corresponding one series arm 32, and each of parallel arm resonators Rp1 through Rp4 is coupled to the corresponding one parallel arm 34. When a plurality of series resonators are coupled to one series arm 32, this structure corresponds to the structure in which one series arm resonator is divided. Thus, the plurality of series resonators in one series arm 32 are merged into each of the series arm resonators Rs1 through Rs4. Similarly, when a plurality of parallel resonators are coupled to one parallel arm 34, the plurality of parallel resonators are merged into each of the parallel arm resonators Rp1 through Rp4.

The series arm resonators Rs1 through Rs4 respectively have electrostatic capacitances Cos1 through Cos4. The parallel arm resonators Rp1 through Rp4 respectively have electrostatic capacitances Cop1 through Cop4. The product of the electrostatic capacitances of the adjacent series and parallel arm resonators of the series arm resonators Rs1 through Rs4 and the parallel arm resonators Rp1 through Rp4 is represented by Cos1×Cop1, Cop1×Cos2, Cos2×Cop2, Cop2×Cos 3, Cos 3×Cop 3, Cop 3×Cos4, and Cos4×Cop4 in this order from the terminal T1 side. The average of the products of the electrostatic capacitances of the adjacent series and parallel arm resonators of the series arm resonators Rs1 through Rs4 and the parallel arm resonators Rp1 through Rp4 (i.e., the sum of the above seven products of the electrostatic capacitances/7) is represented by (Cos×Cop) ave.

The number of series arm resonators is assumed to be N, and the number of parallel arm resonators is assumed to be M. Here, N and M are in the relation where M=N−1, M=N, or M=N+1. Here, the case of M=N in FIG. 12 will be described as an example. In this case the electrostatic capacitances of series arm resonators Rs1, Rs2 . . . Rsi . . . Rsn are respectively represented by Cos1, Cos2 . . . Cosi . . . Cosn, and the electrostatic capacitances of parallel arm resonators Rp1, Rp2 . . . Rpi . . . Rpn are respectively represented by Cop1, Cop2 . . . Copi . . . Copn. At this time, the product of the electrostatic capacitances becomes a value calculated by summing up (Cosi×Copi+Copi×Cos(i+1)) from i=1 to N−1 and then adding CosN×CopN to the sum. The average of the products of the electrostatic capacitances (Cos×Cop)ave becomes a value calculated by dividing the products of the electrostatic capacitances by 2N−1. The values in the case of M=N−1 or M=N+1 can be calculated in the same manner.

The optimization design was performed so that the characteristic impedance Zo of the ladder circuit 30 became the target characteristic impedance at all the nodes N1 through N4. FIG. 13A through FIG. 14B respectively present the electrostatic capacitance of each resonator and the product of electrostatic capacitances when the characteristic impedance Zo is 50Ω, 100Ω, 150Ω, and 200Ω. As presented in FIG. 13A, when the characteristic impedance Zo is 50Ω, Cos×Cop of a basic section calculated from the equation 5 is 2.533 $pF^2$ when the center frequency is set to 2000 MHz. (Cos×Cop)ave that is optimized for the ladder filter having four basic sections is 2.3213 $pF^2$. Thus (Cos×Cop)ave/(Cos× Cop) is 0.91.

As presented in FIG. 13B, when the characteristic impedance Zo is 100Ω, Cos×Cop=0.6333 $pF^2$, and (Cos×Cop) ave=0.5975 $pF^2$. (Cos×Cop)ave/(Cos×Cop) is 0.94. As presented in FIG. 14A, when the characteristic impedance Zo is 150Ω, Cos×Cop=0.2814 $pF^2$, and (Cos×Cop)ave=0.2975 $pF^2$. (Cos×Cop)ave/(Cos×Cop) is 1.06. As presented in FIG.

14B, when the characteristic impedance Zo is 200Ω, Cos×Cop=0.1583 pF², and (Cos×Cop)ave=0.1595 pF². (Cos×Cop)ave/(Cos×Cop) is 1.01.

As described above, (Cos×Cop)ave is within the range of ±10% of Cos×Cop of a basic section calculated by the equation 5. Therefore, (Cos×Cop)ave for achieving 100Ω as the characteristic impedance Zo is expressed by the following equation in which Cos×Cop of the equation 5 is replaced by (Cos×Cop)ave.

$$Zo^2=1/((2\pi fo)^2(Cos \times Cop)ave) \geq 100^2 \quad (6)$$

When the unit of the electrostatic capacitance is pF, and the unit of the center frequency fo is GHz, and (Cos×Cop)ave is assumed to have an error of 1±0.1, the following equation is obtained.

$$(Cos \times Cop)ave \leq 2.533(1\pm 0.1)/fo^2 \quad (7)$$

When an error is assumed to be 1+0.1, the following equation is obtained.

$$(Cos \times Cop)ave \leq 2.7863/fo^2 \quad (8)$$

As described above, the relation of the electrostatic capacitances of the series arm resonators Rs1 through Rs4 and the parallel arm resonators Rp1 through Rp4 with which the characteristic impedance Zo becomes 100Ω or greater is expressed by the equation 8.

Figure 15A:
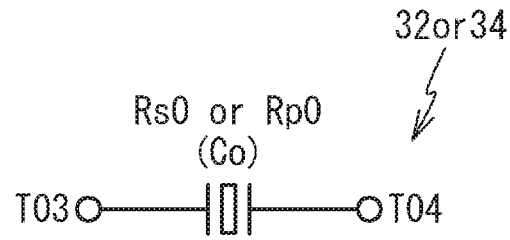
FIG. 15A is a circuit diagram of one arm resonator.
Figure 15B:
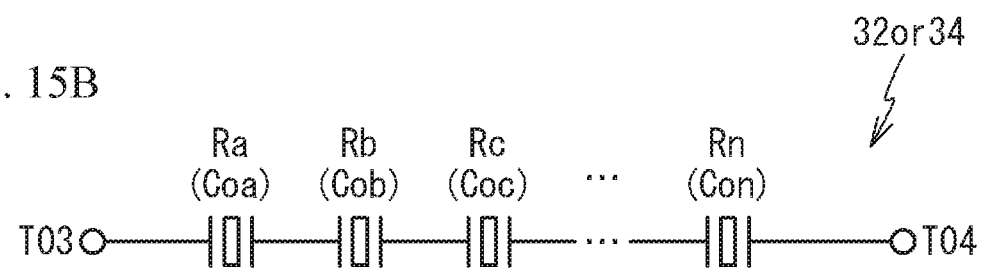
FIG. 15B is a circuit diagram in which one resonator is serially divided.
Figure 15C:
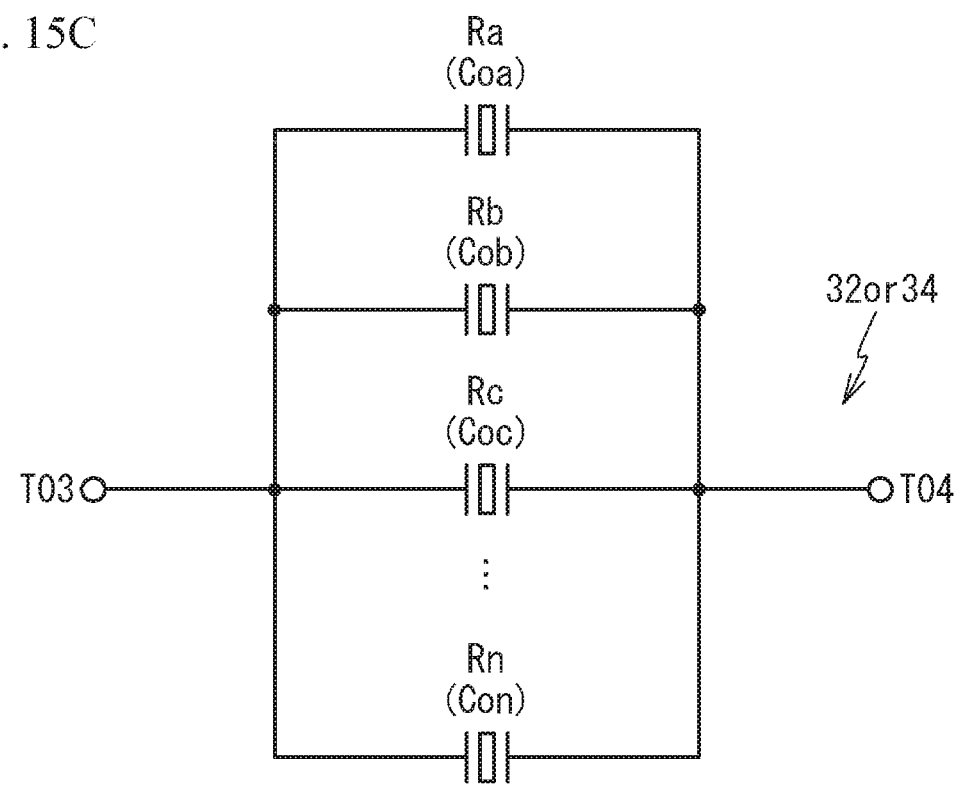
FIG. 15C is a circuit diagram in which one resonator is divided in parallel.

In FIG. 12, described is an exemplary case where each of the series arm resonators Rs1 through Rs4 is coupled to the corresponding one series arm 32 and each of the parallel arm resonators Rp1 through Rp4 is coupled to the corresponding one parallel arm 34. There is a case where at least one of the series arm resonators Rs1 through Rs4 and the parallel arm resonators Rp1 through Rp4 is divided into two or more. FIG. 15A is a circuit diagram illustrating a series arm resonator or a parallel arm resonator before divided, FIG. 15B is a circuit diagram in which one series arm resonator or one parallel arm resonator is serially divided, and FIG. 15C is a circuit diagram in which one series arm resonator or one parallel arm resonator is divided in parallel. As illustrated in FIG. 15A, when one series arm 32 is located between terminals T03 and T04, one series arm resonator Rs0 is connected between the terminals T03 and T04. When one parallel arm 34 is located between the terminals T03 and T04, one parallel arm resonator Rp0 is connected between the terminals T03 and T04.

As illustrated in FIG. 15B, between the terminal T03 and the terminal T04, one series arm resonator Rs0 or one parallel arm resonator Rp0 is serially divided into resonators Ra, Rb, and Rc through Rn. When the electrostatic capacitances of the resonators Ra, Rb, and Rc through Rn are respectively represented by Coa, Cob, and Coc through Con, the electrostatic capacitance of the series arm resonator Rs0 or the parallel arm resonator Rp0 into which the serially divided resonators Ra, Rb, and Rc through Rn are merged is Co=1/(1/Coa+1/Cob+1/Coc+ . . . +1/Con).

As illustrated in FIG. 15C, between the terminals T03 and T04, the series arm resonator Rs0 or the parallel arm resonator Rp0 is divided into the resonators Ra, Rb, and Rc through Rn in parallel. At this time, the electrostatic capacitance of the series arm resonator Rs0 or the parallel arm resonator Rp0 into which the resonators Ra, Rb, Rc through Rn divided in parallel are merged is Co=Coa+Cob+Coc+ . . . +Con. When the series arm resonator Rs0 and the parallel arm resonator Rp0 are divided, the electrostatic capacitances of the series arm resonator Rs0 and the parallel arm resonator Rp0 can be calculated as described above.

In the first embodiment, as illustrated in FIG. 6, the ladder circuit 30 includes one or more series resonators S1 through S4 (series acoustic wave resonators) connected in series between the input terminal Tin and the output terminal Tout and one or more parallel resonators P1 through P4 (parallel acoustic wave resonators) connected in parallel between the input terminal Tin and the output terminal Tout. As illustrated in FIG. 11, the characteristic impedance Zo in the passband of the ladder circuit 30 is greater than the input impedance Zin in the passband of the input terminal Tin and the output impedance Zout in the passband of the output terminal Tout. This configuration can reduce the current value $I^2$. Thus, the power durability and/or the linearity of the filter 100 can be improved.

To improve the power durability and/or the linearity, it is sufficient if the characteristic impedance Zo is greater than at least one of the input impedance Zin and the output impedance Zout.

To improve the power durability and/or the linearity, it is sufficient if the characteristic impedance Zo at least one point in the pathway between the terminals T1 and T2 of the ladder circuit 30 is greater than at least one of the input impedance Zin and the output impedance Zout. To further improve the power durability and/or the linearity, the characteristic impedance Zo is preferably greater than at least one of the output impedance Zout and the input impedance Zin at any point in the pathway in the ladder circuit 30.

In addition, to make the current value $I^2$ at highest frequency of the passband which is the weakest power durability, 2030 MHz, half of the current value $I^2$ of the second comparative example or less as presented in FIG. 11, the characteristic impedance Zo at least one point is preferably more than twice at least one of the input impedance Zin and the output impedance Zout. In addition, the characteristic impedance Zo is preferably more than twice at least one of the input impedance Zin and the output impedance Zout at any point in the pathway in the ladder circuit 30. The characteristic impedance Zo is more preferably more than twice both the input impedance Zin and the output impedance Zout at any point in the pathway in the ladder circuit 30. The characteristic impedance Zo is more preferably more than 2.5 times, further preferably more than 3 times the input impedance Zin and/or the output impedance Zout.

When at least one of the input impedance Zin and the output impedance Zout is practically 50Ω, the characteristic impedance Zo at least one point is preferably 100Ω or greater, and more preferably, the characteristic impedance Zo is 100Ω or greater at any point in the ladder circuit 30. The characteristic impedance Zo is more preferably 125Ω or greater, further preferably 150Ω or greater.

As described in FIG. 15A through FIG. 15C, one or more series acoustic wave resonators are merged so that one series arm resonator Rs0 is coupled to one series arm 32, and one or more parallel acoustic wave resonators are merged so that one parallel arm resonator Rp0 is coupled to one parallel arm 34. As illustrated in FIG. 12, when the average of the products of the electrostatic capacitances of all the adjacent series and parallel arm resonators of the series arm resonators Rs1 through Rs4 and the parallel arm resonators Rp1 through Rp4 is represented by (Cos×Cop)ave [pF], and the center frequency of the passband of the filter 100 is represented by fo [GHz], $(Cos \times Cop)ave \leq 2.7863/fo^2$ is preferably achieved. This configuration allows the characteristic impedance Zo to be 100Ω or greater. The condition for making the characteristic impedance Zo 125Ω or greater is (Cos×Cop)ave≤1.7832/fo². The condition for making the characteristic impedance Zo 150Ω or greater is (Cos×Cop)ave≤1.2384/fo².

The input impedance conversion section 40 converts the input impedance Zin into the characteristic impedance Zo of the ladder circuit 30. Accordingly, the impedance of the input terminal Tin and the impedance of the ladder circuit 30 can be matched. The output impedance conversion section 42 converts the characteristic impedance Zo of the ladder circuit 30 into the output impedance Zout. Accordingly, the impedance of the ladder circuit 30 and the impedance of the output terminal Tout can be matched.

Second Embodiment

Figure 16:
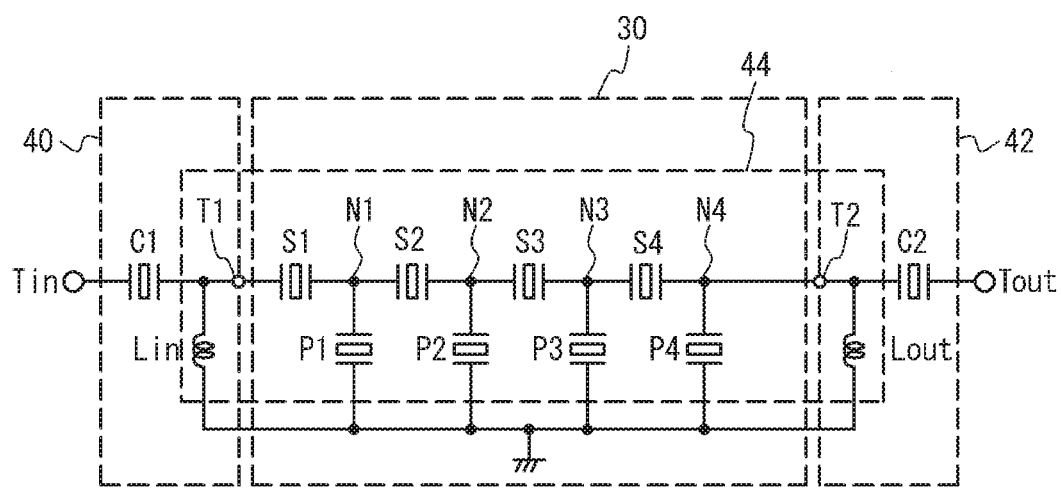
FIG. 16 is a circuit diagram of a filter in accordance with a second embodiment.

FIG. 16 is a circuit diagram of a filter in accordance with a second embodiment. As illustrated in FIG. 16, the input impedance conversion section 40 includes the capacitor C1 connected in series between the input terminal Tin and the terminal T1 and the inductor Lin connected between the terminal T1 and a ground. The output impedance conversion section 42 includes the capacitor C2 connected in series between the terminal T2 and the output terminal Tout, and the inductor Lout connected between the terminal T2 and a ground. The capacitors C1 and C2 are acoustic wave resonators, and formed on the substrate 44 on which the series resonators S1 through S4 and the parallel resonators P1 through P4 are formed.

The input impedance conversion section 40 and the output impedance conversion section 42 may be the low-pass filters described in the first embodiment, or may be the high-pass filters described in the second embodiment. The capacitors C1 and C2 may have power durability less than those of the inductors Lin and Lout. In this case, when the capacitors C1 and C2 are coupled to a series pathway between the input terminal Tin and the output terminal Tout, a large current may break the capacitors C1 and C2. Thus, the input impedance conversion section 40 and the output impedance conversion section 42 are preferably made to be the low-pass filters described in the first embodiment, and the capacitors C1 and C2 are preferably connected in shunt with the series pathway.

An exemplary case where acoustic wave resonators are used as the capacitors C1 and C2 has been described, but the capacitors C1 and C2 may be, for example, Metal Insulator Metal (MIM) thin film capacitors. The inductors Lin and Lout may be, for example, chip inductors, or may be formed with wiring lines in a mounting substrate on which the ladder circuit 30 is to be mounted. Alternatively, the inductors Lin and Lout may be formed on the same substrate 44 on which the acoustic wave resonator is also formed with use of, for example, Integrated Passive Device (IPD) technology.

Figure 17:
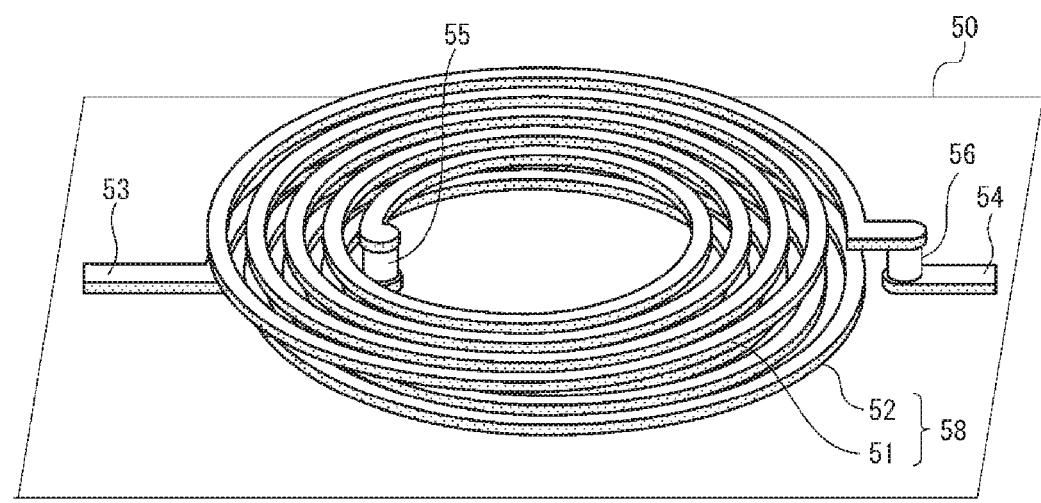
FIG. 17 is a perspective view of an inductor using IPD technology.

FIG. 17 is a perspective view of an inductor formed by using the IPD technology. An inductor 58 is located on a substrate 50. The inductor 58 includes spiral coils 51 and 52. The coil 51 is located on the substrate 50, and the coil 52 is located above the coil 51 across an air gap. The coil 51 and the coil 52 are located so as to substantially overlap each other. Wiring lines 53 and 54 are located on the substrate 50. The wiring line 53 is coupled to the coil 52 at the end of the outermost periphery of the coil 52. The wiring line 54 is coupled to the coil 51 through a connection wiring line 56 at the end of the outermost periphery of the coil 51. The coils 51 and 52 are interconnected through a connection wiring line 55 at the end of the innermost periphery.

The outer perimeter of the inductor 58 is, for example, 350 μm, and the coils 51 and 52 are copper wiring with a film thickness of 10 μm. The height of the air gap between the coils 51 and 52 is approximately 15 μm. Since the air gap is located between the coils 51 and 52, the Q-value of the inductor can be made to be high, for example, 50. To inhibit the deformation of the coils 51 and 52 due to external impact, the coils 51 and 52 may be supported by a supporting post.

In the case of a surface acoustic wave filter, the substrate 50 corresponds to the piezoelectric substrate 10 of FIG. 1A and FIG. 1B. In the case of a bulk acoustic wave filter, the substrate 50 corresponds to the substrate 20 of FIG. 2A and FIG. 2B. The substrate 50 is preferably an insulating substrate having a small permittivity, and is preferably, for example, a sapphire substrate, a spinel substrate, or an alumina substrate. A lithium tantalate substrate or a lithium niobate substrate has a relative permittivity of approximately 40, which is large. Thus, when the substrate 50 is a lithium tantalate substrate or a lithium niobate substrate, it is preferable to provide an insulating film with a low permittivity or an air gap between the coil 52 and the substrate 50. When the inductor is located on the same substrate on which the acoustic wave resonator is also located, the size can be decreased.

Third Embodiment

Figure 18A:
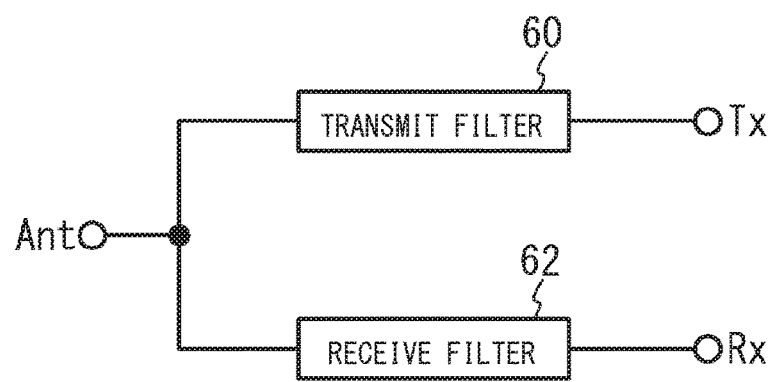
FIG. 18A is a block diagram of a duplexer in accordance with a third embodiment.
Figure 18B:
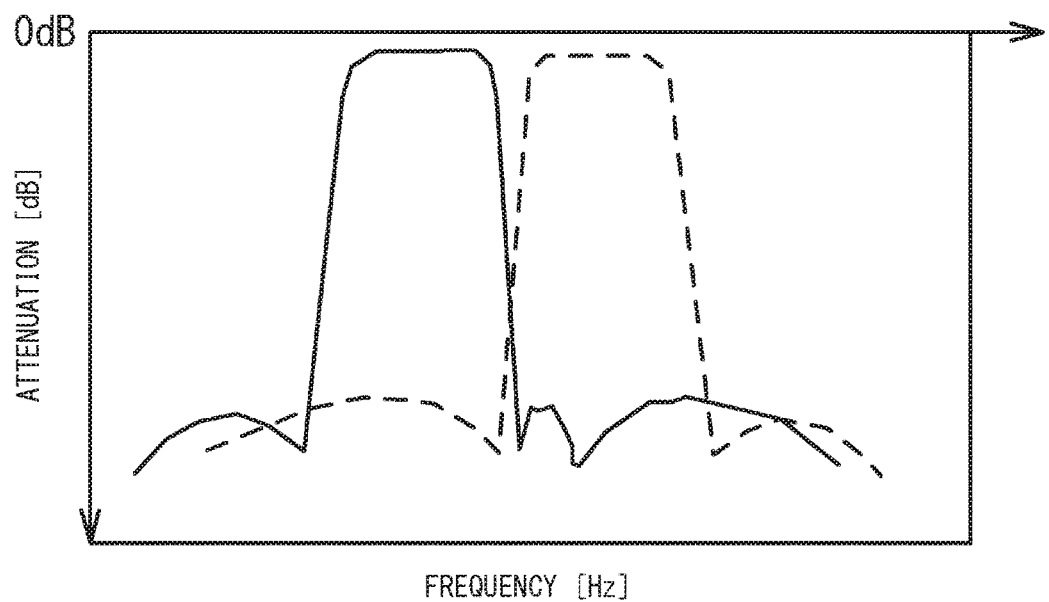
FIG. 18B illustrates a transmission characteristic.

A third embodiment is an exemplary duplexer using the filter of the first or second embodiment. FIG. 18A is a block diagram of a duplexer in accordance with the third embodiment, and FIG. 18B illustrates the transmission characteristic. As illustrated in FIG. 18A, a transmit filter 60 is connected between a common terminal Ant and a transmit terminal Tx. A receive filter 62 is connected between the common terminal Ant and a receive terminal Rx. In FIG. 18B, the solid line indicates the transmission characteristic from the transmit terminal Tx to the common terminal Ant (i.e., the pass characteristic of the transmit filter 60) and the dashed line indicates the transmission characteristic from the common terminal Ant to the receive terminal Rx (i.e., the transmission characteristic of the receive filter 62). The transmit filter 60 allows signals in the transmit band to pass therethrough among high-frequency signals input to the transmit terminal Tx, and suppresses signals outside the transmit band. The receive filter 62 allows signals in the receive band to pass therethrough among high-frequency signals input to the common terminal Ant, and suppresses signals outside the receive band. The transmit band and the receive band are near to each other, but do not overlap.

The power durability and/or the linearity can be improved by using the filter of the first or second embodiment for at least one of the transmit filter 60 and the receive filter 62. A high-frequency signal with a large electrical power is input especially to the transmit filter 60. Therefore, the filter of the first or second embodiment is preferably used for the transmit filter 60. This configuration can improve the power durability and/or the linearity of the duplexer. The duplexer has been described as an example of a multiplexer, but the multiplexer may be a triplexer including three filters, a quadplexer including four filters, a hexaplexer including six filters, or an octoplexer including eight filters.

Although the embodiments of the present invention have been described in detail, it is to be understood that the various change, substitutions, and alterations could be made hereto without departing from the spirit and scope of the invention.

What is claimed is:

1. A filter comprising:
an input terminal;
an output terminal; and
a ladder circuit that includes one or more series acoustic wave resonators connected in series between the input terminal and the output terminal and one or more parallel acoustic wave resonators connected in parallel between the input terminal and the output terminal, and in which characteristic impedance of at least one point in a pathway between the input terminal and the output terminal at a center frequency of a passband is greater than input impedance of the input terminal and output impedance of the output terminal at the center frequency of the passband.

2. The filter according to claim 1, wherein
the characteristic impedance of the at least one point is more than twice the input impedance and the output impedance.

3. The filter according to claim 1, wherein
characteristic impedance at the center frequency of the passband is greater than the the input impedance and the output impedance at any point in the pathway in the ladder circuit.

4. The filter according to claim 1, wherein
characteristic impedance at the center frequency of the passband is more than twice the input impedance and the output impedance at any point in the pathway in the ladder circuit.

5. The filter according to claim 4, wherein
the input impedance and the output impedance are practically 50Ω,
the one or more series acoustic wave resonators are merged so that one series arm resonator is coupled to one series arm, and the one or more parallel acoustic wave resonators are merged so that one parallel arm resonator is coupled to one parallel arm, and
(Cos×Cop)ave≤2.7863/fo² where an average of products of electrostatic capacitances of all adjacent series and parallel arm resonators of the series arm resonator and the parallel arm resonator is represented by (Cos×Cop) ave [pF²], and a center frequency of the passband of the filter is represented by fo [GHz].

6. The filter according to claim 4, further comprising;
an input impedance conversion section configured to convert the input impedance into the characteristic impedance of the inner ladder circuit; and
an output impedance conversion section configured to convert the characteristic impedance of the inner ladder circuit into the output impedance.

7. The filter according to claim 6, further comprising
a substrate on which the one or more series acoustic wave resonators and the one or more parallel acoustic wave resonators are formed, wherein
at least one of the output impedance conversion section and the input impedance conversion section includes a capacitor that is an acoustic wave resonator formed on the substrate.

8. The filter according to claim 6, further comprising
a substrate on which the one or more series acoustic wave resonators and the one or more parallel acoustic wave resonators are formed, wherein
at least one of the output impedance conversion section and the input impedance conversion section includes a capacitor that is the electrostatic capacitor of an acoustic wave resonator formed on the substrate, the resonance frequency of which is less than half or more than twice of the center frequency of the inner ladder filter.

9. The filter according to claim 1, further comprising;
an input impedance conversion section configured to convert the input impedance into the characteristic impedance of the at least one point; and
an output impedance conversion section configured to convert the characteristic impedance of the at least one point into the output impedance.

10. The filter according to claim 9, further comprising
a substrate on which the one or more series acoustic wave resonators and the one or more parallel acoustic wave resonators are formed, wherein
at least one of the output impedance conversion section and the input impedance conversion section includes a capacitor that is an acoustic wave resonator formed on the substrate.

11. The filter according to claim 1, wherein
the input impedance and the output impedance are practically 50Ω,
the one or more series acoustic wave resonators are merged so that one series arm resonator is coupled to one series arm, and the one or more parallel acoustic wave resonators are merged so that one parallel arm resonator is coupled to one parallel arm, and
(Cos×Cop)ave≤2.7863/fo² where an average of products of electrostatic capacitances of all adjacent series and parallel arm resonators of the series arm resonator and the parallel arm resonator is represented by (Cos×Cop) ave [pF²], and a center frequency of the passband of the filter is represented by fo [GHz].

12. A filter comprising:
an input terminal;
an output terminal; and
a ladder circuit that includes one or more series acoustic wave resonators connected in series between the input terminal and the output terminal and one or more parallel acoustic wave resonators connected in parallel between the input terminal and the output terminal, and in which characteristic impedance of at least one point in a pathway between the input terminal and the output terminal in a passband is greater than at least one of input impedance of the input terminal and output impedance of the output terminal in the passband,
wherein
the at least one of the input impedance and the output impedance is practically 50Ω, and
the characteristic impedance of the at least one point is 100Ω or greater.

13. The filter according to claim 12, wherein
the characteristic impedance of the at least one point is greater than the input impedance and the output impedance.

14. A multiplexer comprising:
a filter including:
an input terminal;
an output terminal; and
a ladder circuit that includes one or more series acoustic wave resonators connected in series between the input terminal and the output terminal and one or more parallel acoustic wave resonators connected in parallel between the input terminal and the output terminal, and in which characteristic impedance of at least one point in a pathway between the input terminal and the output terminal at a center frequency of a passband is greater than input impedance of the input terminal and output impedance of the output terminal at the center frequency of the passband.

15. The multiplexer according to claim 14, further comprising:
   a transmit filter connected between a common terminal and a transmit terminal; and
   a receive filter connected between the common terminal and a receive terminal, wherein the filter is the transmit filter.

* * * * *